United States Patent [19]

Hsueh

[11] Patent Number: 5,241,511
[45] Date of Patent: Aug. 31, 1993

[54] BICMOS MEMORY WORD LINE DRIVER

[75] Inventor: Paul W. Hsueh, Chandler, Ariz.

[73] Assignee: Motorola, Inc., Schaumburg, Ill.

[21] Appl. No.: 751,011

[22] Filed: Aug. 28, 1991

[51] Int. Cl.$^5$ .................. G11C 8/00; H03K 19/096
[52] U.S. Cl. ........................... 365/230.06; 307/449
[58] Field of Search .............. 365/230.06, 189.11; 307/449

[56] References Cited

U.S. PATENT DOCUMENTS 4,618,784  10/1986  Chappell et al. ........ 365/230.06 X
4,843,261   6/1989  Chappell et al. ........ 365/230.06 X Primary Examiner—Joseph A. Popek
Attorney, Agent, or Firm—Robert D. Atkins

[57] ABSTRACT

A word line driver in a memory block circuit provides reduced propagation delay for a block control signal and higher output drive to the memory cells in a selected row. The block control signal passes through an isolation transistor in response to a first state of a maxi control signal. The block control signal is blocked by the isolation transistor in responsive to a second state of the maxi control signal which reduces capacitive loading on the block control signal and decreases its propagation delay. The combination of the block control signal and the maxi control signal enables a bipolar transistor to generate a high output drive row select signal to activate the memory cells in the selected row.

16 Claims, 3 Drawing Sheets

BICMOS MEMORY WORD LINE DRIVER

BACKGROUND OF THE INVENTION

This invention relates in general to word line drivers and, more particularly, to a BICMOS memory word line driver.

Memory circuits are typically arranged in a row/column alignment where the memory cells are divided into logical blocks, say sixty-four bits wide and eighty bits deep. The memory circuit overall may contain many memory blocks. Each memory cell (one bit) is addressable by the combination of a word line and a column line which selects the x-coordinate and y-coordinate of a single memory cell. There are sixty-four word line drivers for the 64×80 bit memory block, one for each row of eighty memory cells.

A conventional word line driver comprises p-channel and n-channel MOS transistors arranged as an inverter with common gates. A $\overline{BLOCK}$ control signal activates sixty-four word line drivers associated with a particular memory block. Thus, the $\overline{BLOCK}$ control signal is continuously loaded by the gate capacitance of sixty-four inverting transistor pairs. A plurality of MAXI control signals enable respective word line drivers across all memory blocks. For example, one MAXI control signal may enable the first word line driver in every memory block. The combination of the $\overline{BLOCK}$ control signal and one MAXI control signal selects one word line driver and, correspondingly, a group of eighty memory cells. BIT and $\overline{BIT}$ data signals then write to and read from the desired memory cell.

A principal problem with the prior art word line drivers is the unbalanced loading between the $\overline{BLOCK}$ control signals and the MAXI control signals. The $\overline{BLOCK}$ control signal drives sixty-four word line drivers (gate capacitance of at least 128 transistors), while each MAXI control signal may drive only four memory blocks (gate capacitance of eight transistors). The propagation delay for the $\overline{BLOCK}$ control signal is much longer than the propagation delay of the MAXI control signals. The operating speed of the memory circuit is thus limited by the slower propagation rate of the $\overline{BLOCK}$ control signal.

Another drawback with prior art word line drivers is the strict MOS transistor implementation. The output drive capacity of MOS transistors is much less than other technologies such as bipolar, given similar geometries.

Hence, what is needed is an improved word line driver having reduced propagation delay for the $\overline{BLOCK}$ control signal while providing higher output drive to enable the memory cells.

SUMMARY OF THE INVENTION

Briefly stated, the invention comprises a memory circuit with a word line driver responsive to first and second control signals for activating a plurality of memory cells. The word line driver comprises a first circuit responsive to a first state of the first control signal for passing the second control signal to an output having a capacitive load. The first circuit is also responsive to a second state of the first control signal for isolating the second control signal from the output of the first circuit which reduces capacitive loading on the second control signal. A second circuit has an input coupled to the output of the first circuit for generating a third control signal to activate the plurality of memory cells when the second control signal passes through the first circuit.

In another aspect, the present invention is a method of activating a plurality of memory cells comprising the steps of passing a first control signal through an isolation transistor in response to a first state of a second control signal, while isolating the first control signal with the isolation transistor in responsive to a second state of the second control signal which reduces capacitive loading on the first control signal. A third control signal is generated to activate the plurality of memory cells when the first control signal is passed through the isolation transistor.

DETAILED DESCRIPTION OF THE PREFERRED EMBODIMENT

Figure 1:
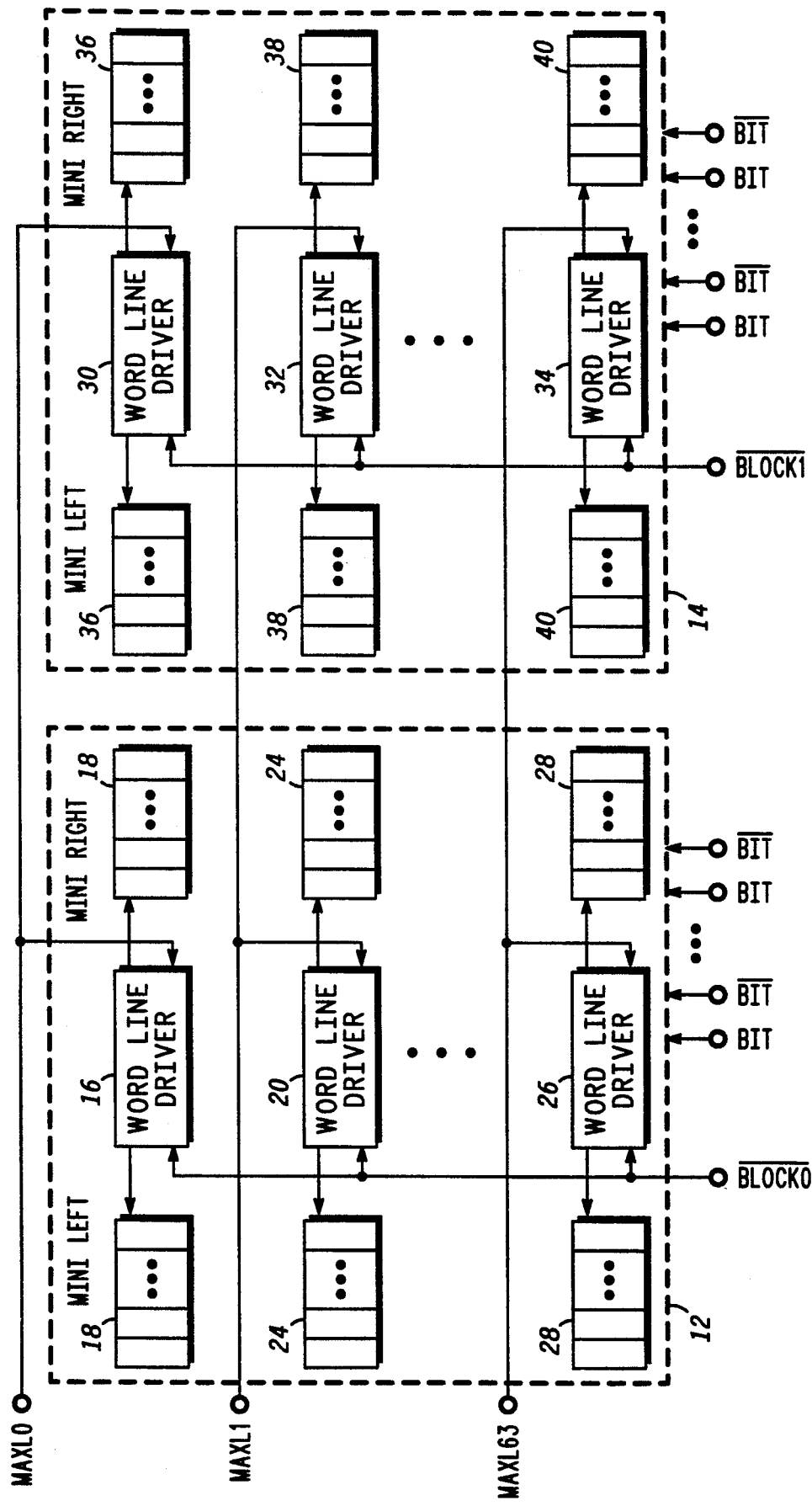
FIG. 1 is a simplified block diagram illustrating a memory block arrangement.

A memory circuit 10 is shown in FIG. 1 arranged in a divided block architecture including memory block 12 and memory block 14. Memory circuit 10 typically contains many more memory blocks like 12 and 14. In one example, memory blocks 12 and 14 may each contain sixty-four rows of eighty memory cells per row, wherein each memory cell stores one bit of information.

Word line driver 16 is responsive to a logic one MAXI0 control signal and a logic zero $\overline{BLOCK0}$ control signal for generating control signals MINI LEFT and MINI RIGHT to enable memory cell row 18. The MINI LEFT control signal is applied to a left-half of memory cell row 18, and the MINI RIGHT control signal is applied to a right-half of memory cell row 18, each half containing forty memory cells. Dividing memory cell row 18 in half and generating MINI LEFT and MINI RIGHT control signals reduces the propagation delay for each half.

A second row of eighty memory cells is activated by word line driver 20 for enabling memory cell row 24 in response to a logic one MAXI1 control signal and a logic zero $\overline{BLOCK0}$ control signal. Memory cell row 24 is also divided into a left-half and a right-half of forty memory cells each. The sixty-fourth row of eighty memory cells is activated by word line driver 26 for enabling memory cell row 28 in response to control signals MAXI63 and $\overline{BLOCK0}$. Memory block 12 receives eighty pairs of data lines BIT and $\overline{BIT}$ respectively coupled to memory cell rows 18, 24 and 28 for writing to and reading data from the individual memory cells.

Memory block 14 is constructed in a similar manner as described for memory block 12 including sixty-four word line drivers 30, 32 through 34 responsive to a logic zero $\overline{BLOCK1}$ control signal for selecting memory block 14. Word line drivers 30–34 also receive control signals MAXI0, MAXI1 through MAXI63, respectively, for selecting one of memory cell rows 36, 38 through 40.

Figure 2:
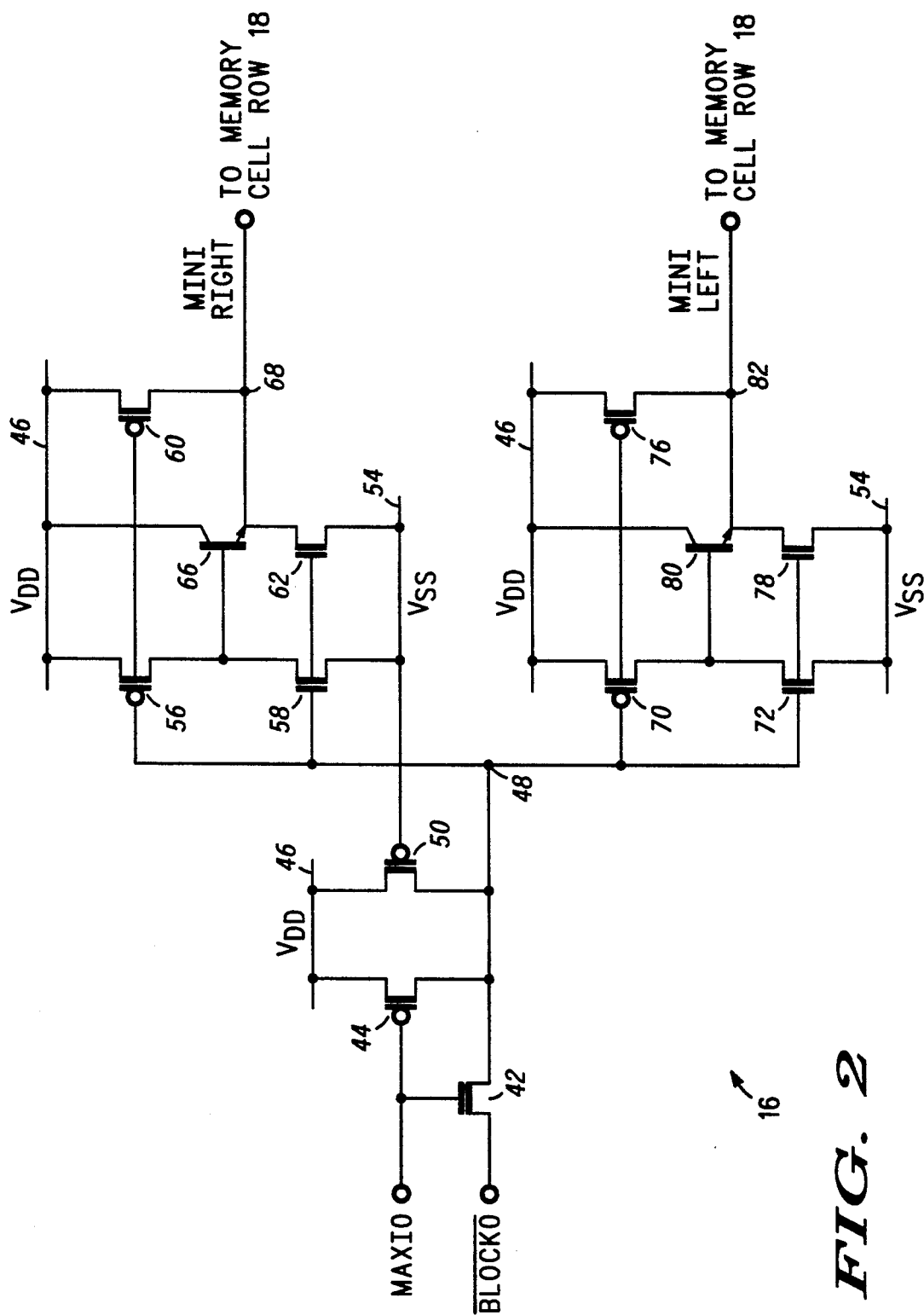
FIG. 2 is a schematic diagram of a word line driver of FIG. 1.

Turning to FIG. 2, there is shown further detail of word line driver 16 including transistor 42 having a drain coupled for receiving the $\overline{BLOCK0}$ control signal and a gate coupled for receiving the MAXI0 control signal. Transistor 44 also receives the MAXI0 control signal at its gate. The source of transistor 44 is coupled to power supply conductor 46 operating at a positive potential such as $V_{DD}$, and the drain of transistor 44 is coupled to the source of transistor 42 at node 48. Transistor 50 includes a source coupled to power supply conductor 46, a drain coupled to node 48, and a gate coupled to power supply conductor 54 operating at ground potential.

The signal at node 48 drives first and second driver circuits for generating the MINI LEFT and MINI RIGHT control signals to memory cell row 18. The drive circuit for the MINI RIGHT control signal includes transistors 56 and 58 configured as an inverting buffer with the sources of transistors 56 and 58 coupled to power supply conductors 46 and 54, respectively, and the drain of transistor 56 coupled to the drain of transistor 58. The common gates of transistors 56 and 58 are also coupled to the gates of transistors 60 and 62. The source of transistor 60 is coupled to power supply conductor 46, and the source of transistor 62 is coupled to power supply conductor 54.

Bipolar transistor 66 includes a collector coupled to power supply conductor 46, a base coupled to the interconnection of the drains of transistors 56 and 58, and an emitter coupled to node 68 at the common drains of transistors 60-62 for providing the MINI RIGHT control signal to memory cell 18.

The drive circuit for the MINI LEFT control signal includes transistors 70 and 72 also configured as an inverting buffer with the sources of transistors 70 and 72 coupled to power supply conductors 46 and 54, respectively, and the drain of transistor 70 coupled to the drain of transistor 72. The common gates of transistors 70 and 72 are coupled to node 48 and to the gates of transistors 76 and 78. The source of transistor 76 is coupled to power supply conductor 46, and the source of transistor 78 is coupled to power supply conductor 54.

Bipolar transistor 80 includes a collector coupled to power supply conductor 46, a base coupled to the interconnection of the drains of transistors 70 and 72, and an emitter coupled to node 82 at the common drains of transistors 76-78 for providing the MINI LEFT control signal to memory cell 18. Word line drivers 20, 26 and 30-34 follow a similar construction as described for word line driver 16.

The operation of word line driver 16 proceeds as follows. Memory cell row 18 is selected when the MAXI0 control signal is logic one and the $\overline{\text{BLOCK0}}$ control signal is logic zero. Transistor 42 conducts with the MAXI0 control signal at logic one, thereby passing the logic zero $\overline{\text{BLOCK0}}$ control signal to node 48. The logic zero at node 48 is inverted by transistors 56-58 and 70-72 for providing a high signal at the bases of bipolar transistors 66 and 80 to pull the MINI RIGHT and MINI LEFT control signals at nodes 68 and 82 to logic one and enable memory cell row 18. The use of bipolar transistors 66 and 80 in word line driver 16 increases the output drive for the MINI RIGHT and MINI LEFT control signals. Transistors 60 and 76 serve to pull the potential at nodes 68 and 82 closer to power supply conductor 46.

Alternately, a logic one $\overline{\text{BLOCK0}}$ control signal at node 48 produces a low signal at the bases of transistors 66 and 80 and allows transistors 62 and 78 to draw nodes 68 and 82 to the logic zero at power supply conductor 54. Transistor 50 is a small device and serves to pull the logic one at node 48 closer to power supply conductor 46.

When the MAXI0 control signal is logic zero, transistor 42 is turned off and the gate capacitances of transistors 56-62 and 70-78 are isolated from the $\overline{\text{BLOCK0}}$ control signal. Transistors 44 and 50 pull node 48 to logic one when transistor 42 is off, leaving the MINI RIGHT and MINI LEFT control signals at false logic zero.

Thus, one principal advantage of the present invention is the ability to isolate the $\overline{\text{BLOCK0}}$ control signal from the gate capacitances of transistors 56-62 and 70-78 when word line driver 16 is de-selected and transistor 42 is off. The decrease in gate capacitance loading reduces the propagation delay for the $\overline{\text{BLOCK0}}$ and $\overline{\text{BLOCK1}}$ control signals and increases the operating speed of memory circuit 10. Furthermore, bipolar transistors 66 and 80 mixed with MOS transistors provides increased output drive for control signals MINI RIGHT and MINI LEFT.

Figure 3:
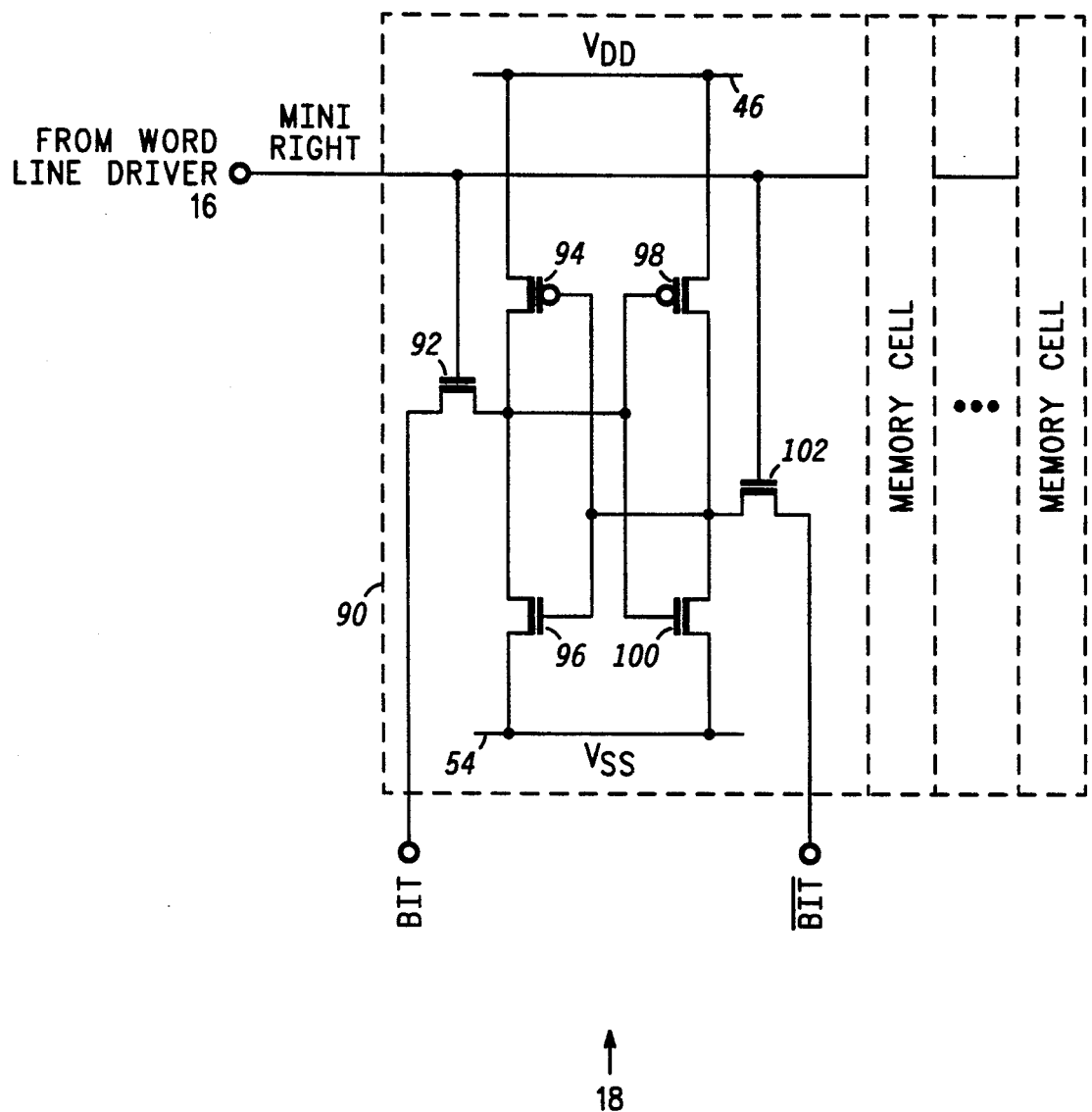
FIG. 3 is a schematic diagram of a memory cell of FIG. 1.

An example of memory cell row 18 is shown in FIG. 3 with memory cell 90 including transistor 92 having a gate coupled for receiving the MINI RIGHT control signal from word line driver 16, and a drain coupled for receiving and sending one BIT data signal. The source of transistor 92 is coupled to the common drains of transistors 94 and 96, while the sources of transistors 94 and 96 are coupled to power supply conductors 46 and 54, respectively. The common gates of transistors 94 and 96 are coupled to the drains of transistors 98 and 100, the latter of which include common gates coupled to the drains of transistors 94 and 96. Transistor 102 includes a gate coupled for receiving the MINI RIGHT control signal, a source coupled to the drains of transistors 98-100, and a drain coupled for receiving and sending one $\overline{\text{BIT}}$data signal.

A logic one MINI RIGHT control signal enables transistors 92 and 102 to latch the BIT and $\overline{\text{BIT}}$data signals at the drains of transistors 98-100 and 94-96, respectively.

Hence, what has been provided is a novel word line driver for reducing propagation delay for the $\overline{\text{BLOCK}}$ control signal while providing high output drive to the memory cells via bipolar transistors.

I claim:

1. In a memory circuit a word line driver responsive to first and second control signals for activating a plurality of memory cells, said word line driver comprising:

first means responsive to a first state of the first control signal for passing the second control signal to an output having a capacitive load, said first means being responsive to a second state of the first control signal for isolating the second control signal from said output of said first means which reduces capacitive loading on the second control signal, said first means including,
  (a) a first transistor having a drain, a gate and a source, said drain being coupled for receiving the second control signal, said gate being coupled for receiving the first control signal, said source being coupled to said output of said first means at a first node, and
  (b) a second transistor having a drain, a gate and a source, said drain being coupled to said first node, said gate being coupled for receiving the first control signal, said source being coupled to a first source of operating potential; and second means having an input coupled to said output of said first means for generating a third control signal to activate the plurality of memory cells when the second control signal passes through said first means.

2. In a memory circuit a word line driver responsive to first and second control signals for activating a plurality of memory cells, said word line driver comprising:

first means responsive to a first state of the first control signal for passing the second control signal to an output having a capacitive load, said first means being responsive to a second state of the first control signal for isolating the second control signal from said output of said first means which reduces capacitive loading on the second control signal, said first means including,
(a) a first transistor having a drain, a gate and a source, said drain being coupled for receiving the second control signal, said gate being coupled for receiving the first control signal, said source being coupled to said output of said first means at a first node,
(b) a second transistor having a drain, a gate and a source, said drain being coupled to said first node, said gate being coupled for receiving the first control signal, said source being coupled to a first source of operating potential, and
(c) a third transistor having a drain, a gate and a source, said drain being coupled to said first node, said gate being coupled to a second source of operating potential, said source being coupled to said first source of operating potential; and second means having an input coupled to said output of said first means for generating a third control signal to activate the plurality of memory cells when the second control signal passes through said first means.

3. The word line driver of claim 2 wherein said second means includes:
a first inverter having an input coupled to said first node and having an output;
a fourth transistor having a base, an emitter and a collector, said base being coupled to said output of said first inverter, said collector being coupled to said first source of operating potential, said emitter providing said third control signal to active the plurality of memory cells;
a fifth transistor having a drain, a gate and a source, said gate being coupled to said first node, said source being coupled to said first source of operating potential, said drain being coupled to said emitter of said fourth transistor; and
a sixth transistor having a drain, a gate and a source, said drain being coupled to said emitter of said fourth transistor, said gate being coupled to said first node, said source being coupled to said second source of operating potential.

4. The word line driver of claim 3 wherein said fourth transistor is a bipolar transistor for providing output drive for said third control signal.

5. The word line driver of claim 4 wherein said first inverter includes:
a seventh transistor having a drain, a gate and a source, said gate being coupled to said first node, said source being coupled to said first source of operating potential, said drain being coupled to said output of said first inverter; and
an eighth transistor having a drain, a gate and a source, said gate being coupled to said first node, said drain being coupled to said output of said first inverter, said source being coupled to said second source of operating potential.

6. The word line driver of claim 5 wherein said second means further includes:
a second inverter having an input coupled to said first node and having an output;
a ninth transistor having a base, an emitter and a collector, said base being coupled to said output of said second inverter, said collector being coupled to said first source of operating potential, said emitter providing a fourth control signal to active a second plurality of memory cells;
a tenth transistor having a drain, a gate and a source, said gate being coupled to said first node, said source being coupled to said first source of operating potential, said drain being coupled to said emitter of said ninth transistor; and
an eleventh transistor having a drain, a gate and a source, said drain being coupled to said emitter of said ninth transistor, said gate being coupled to said first node, said source being coupled to said second source of operating potential.

7. The word line driver of claim 6 wherein said second inverter includes:
a twelfth transistor having a drain, a gate and a source, said gate being coupled to said first node, said source being coupled to said first source of operating potential, said drain being coupled to said output of said second inverter; and
a thirteenth transistor having a drain, a gate and a source, said gate being coupled to said first node, said drain being coupled to said output of said second inverter, said source being coupled to said second source of operating potential.

8. A word line driver responsive to first and second control signals for activating a plurality of memory cells, comprising:

first means responsive to a first state of the first control signal for passing the second control signal to an output, said first means being responsive to a second state of the first control signal for isolating the second control signal from said output of said first means which reduces capacitive loading on the second control signal;
a first inverter having an input coupled to a first node at said output of said first means and having an output;
a first transistor having a base, an emitter and a collector, said base being coupled to said output of said first inverter, said collector being coupled to a first source of operating potential, said emitter providing a third control signal to active the plurality of memory cells; and
a second transistor having a drain, a gate and a source, said drain being coupled to said emitter of said first transistor, said gate being coupled to said first node, said source being coupled to a second source of operating potential.

9. The word line driver of claim 8 further including a third transistor having a drain, a gate and a source, said gate being coupled to said first node, said source being coupled to said first source of operating potential, said drain being coupled to said emitter of said first transistor.

10. The word line driver of claim 9 wherein said first transistor is a bipolar transistor for providing output drive for said third control signal.

11. The word line driver of claim 10 wherein said first means includes:
   a fourth transistor having a drain, a gate and a source, said drain being coupled for receiving the second control signal, said gate being coupled for receiving the first control signal, said source being coupled to said first node; and
   a fifth transistor having a drain, a gate and a source, said drain being coupled to said first node, said gate being coupled for receiving the first control signal, said source being coupled to said first source of operating potential.

12. The word line driver of claim 11 wherein said first means further includes a sixth transistor having a drain, a gate and a source, said drain being coupled to said first node, said gate being coupled to said second source of operating potential, said source being coupled to said first source of operating potential.

13. The word line driver of claim 12 wherein said first inverter includes:
   a seventh transistor having a drain, a gate and a source, said gate being coupled to said first node, said source being coupled to said first source of operating potential, said drain being coupled to said output of said first inverter; and
   an eighth transistor having a drain, a gate and a source, said gate being coupled to said first node, said drain being coupled to said output of said first inverter, said source being coupled to said second source of operating potential.

14. The word line driver of claim 13 further including:
   a second inverter having an input coupled to said first node and having an output;
   a ninth transistor having a base, an emitter and a collector, said base being coupled to said output of said second inverter, said collector being coupled to said first source of operating potential, said emitter providing a fourth control signal to active a second plurality of memory cells;
   a tenth transistor having a drain, a gate and a source, said gate being coupled to said first node, said source being coupled to said first source of operating potential, said drain being coupled to said emitter of said ninth transistor; and
   an eleventh transistor having a drain, a gate and a source, said drain being coupled to said emitter of said ninth transistor, said gate being coupled to said first node, said source being coupled to said second source of operating potential.

15. The word line driver of claim 14 wherein said second inverter includes:
   a twelfth transistor having a drain, a gate and a source, said gate being coupled to said first node, said source being coupled to said first source of operating potential, said drain being coupled to said output of said second inverter; and
   a thirteenth transistor having a drain, a gate and a source, said gate being coupled to said first node, said drain being coupled to said output of said second inverter, said source being coupled to said second source of operating potential.

16. A method of activating a plurality of memory cells, comprising the steps of:
   passing a first control signal through an isolation transistor in response to a first state of a second control signal;
   isolating said first control signal with said isolation transistor in responsive to a second state of said second control signal which reduces capacitive loading on said first control signal;
   generating a third control signal to activate the plurality of memory cells when said first control signal is passed through said isolation transistor;
   inverting said first control signal; and
   activating a bipolar transistor with said inverted first control signal for generating said third control signal.

* * * * *